United States Patent
Cheng et al.

(10) Patent No.: US 7,542,329 B2
(45) Date of Patent: Jun. 2, 2009

(54) VIRTUAL POWER RAILS FOR INTEGRATED CIRCUITS

(75) Inventors: Zhibin Cheng, Cary, NC (US); Satyajit Dutta, Austin, TX (US); Peter J. Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 11/458,616

(22) Filed: Jul. 19, 2006

(65) Prior Publication Data

US 2008/0123458 A1 May 29, 2008

(51) Int. Cl.
 *G11C 11/00* (2006.01)
(52) U.S. Cl. .............. 365/154; 365/49.11; 365/196
(58) Field of Classification Search ........... 365/154, 365/49.11, 196
 See application file for complete search history.

(56) References Cited

U.S. PATENT DOCUMENTS

| | | | |
|---|---|---|---|
| 4,623,989 | A | 11/1986 | Blake |
| 6,724,648 | B2 | 4/2004 | Khellah et al. |
| 6,728,130 | B1 | 4/2004 | Afghahi et al. |
| 6,798,682 | B2 | 9/2004 | Chuang et al. |
| 6,801,463 | B2 | 10/2004 | Khellah et al. |
| 2002/0122329 | A1 | 9/2002 | Ma et al. |
| 2004/0100815 | A1 | 5/2004 | Ye et al. |
| 2004/0125681 | A1 | 7/2004 | Yamaoka et al. |
| 2006/0002223 | A1* | 1/2006 | Song et al. .............. 365/226 |
| 2006/0232321 | A1* | 10/2006 | Chuang et al. ............ 327/427 |
| 2007/0189102 | A1* | 8/2007 | Lin et al. ................ 365/230.06 |

FOREIGN PATENT DOCUMENTS

CN 1725373 A 1/2006

OTHER PUBLICATIONS

M. D. Powell, S.-H. Yang, B. Falsafi, K. Roy, & T. N. Vijaykumar, "Gated Vdd: A Circuit Technique to Reduce Leakage in Deep-Submicron Cache Memories," in Proc. ISLPED, Jul. 2000, pp. 90-95.
C. H. Kim & K. Roy, "Dynamic Vt SRAM: A Leakage Tolerant Cache Memory for Low Voltage Microprocessors," ISLPED 2002: 251-254.

(Continued)

*Primary Examiner*—Thong Q Le
(74) *Attorney, Agent, or Firm*—Mark E. McBurney; Schubert Osterrieder & Nickelson PLLC

(57) ABSTRACT

Methods and apparatuses to decrease power consumption and reduce leakage current of integrated circuits are disclosed. New leakage power saving techniques for various types of integrated circuits, including cache memory circuits, are discussed. Embodiments comprise methods and apparatuses to reduce power consumption in integrated circuits by using virtual voltage rails, or virtual power rails, to supply power to integrated circuit loads. The methods and apparatuses generally involve using one or two virtual power control devices to "head" and "foot", or sandwich, the integrated circuit loads from firm power supply rails. In these method embodiments, one or more elements sense the voltage of the virtual power rails, or nodes, and make adjustments to control the voltage at certain "virtual" voltage potentials. While controlling the voltage in this manner, the virtual power control devices may serve to restrict unnecessary current flow through the integrated circuit loads.

20 Claims, 6 Drawing Sheets

OTHER PUBLICATIONS

A. Agarwal, H. Li, & K. Roy, "A Single-Vt Low-Leakage Gated-Ground Cache for Deep Submicron," Solid-State Circuits, IEEE Journal of, pp. 319-328, vol. 38, Issue: 2, Feb. 2003.

P. Elakkumanan, A. Narasimhan, & R. Sridhar, "NC-SRAM—A Low-Leakage Memory Circuit for Ultra-Deep Submicron Designs", Proceedings, IEEE International SoC Conference 2003, Portland, OR, Sep. 2003, pp. 3-6.

N. Hanchate & N. Ranganathan, "LECTOR: A Technique for Leakage Reduction in CMOS Circuits," IEEE Trans. VLSI Syst., vol. 12, Issue: 2, 2004, pp. 196-205.

* cited by examiner

VIRTUAL POWER RAILS FOR INTEGRATED CIRCUITS

FIELD

The present invention generally relates to the field of integrated circuits. More particularly, the present invention relates to methods, apparatuses, and systems to decrease power consumption of devices, including memory devices, in integrated circuits.

BACKGROUND

Designers generally increase performance of integrated circuits by increasing the operating frequencies and by increasing the number of components, such as transistors, in the circuits. To keep the circuit sizes manageable, designers have reduced or scaled down the size of the circuit components so that larger numbers of devices fit within smaller per unit areas. Today it is not uncommon to find advanced computer system chips that contain millions, even billions, of transistors. This increased density, however, has created numerous problems. One problem is heat. Since individual electronic components, such as transistors, each generate minute quantities of heat when operating, increased numbers of such devices in the newer circuits naturally lead to increased quantities of heat. Another problem is power consumption. Again, since each electronic circuit component consumes a minute amount of power while operating, circuits with increased numbers of such circuit components generally consume larger quantities of power.

As mentioned, designers have increased performance by continually scaling the circuits using deeper and deeper sub-micron technologies, such as 90 nm and 65 nm technologies. They have also improved performance by increasing the clock speeds. They have reduced latencies by reducing the physical channel length of the circuit elements, reducing the voltage supplies for the elements, and reducing the threshold voltages of transistors. However, reduced threshold voltages and reduced channel lengths of transistors have resulted in higher sub-threshold leakage currents. Accordingly, sub-threshold leakage power, increased power consumption, and increased heat dissipation have rapidly become formidable challenges for integrated circuit designers. Moreover, with the increased use of portable electronic systems, reducing power consumption has become a paramount design concern. Power dissipation reduces battery life, decreases system performance, reduces system reliability, and increases system packaging costs.

Among the various types of integrated circuits, there have been many architectural and circuit level studies completed for static random access memory (SRAM) circuits. Some people have reduced leakage current for SRAM circuits by using a power-gating technique. In this method, circuit designers place a gated-ground n-type metal oxide semiconductor (n-MOS) between ground and SRAM cells to turn off the standby actions of the cache and to reduce leakage current. This method produces a problematic floating virtual ground node and causes the circuit to be more susceptible to noise, which can degrade the stability of the data stored in the memory cells.

Other recent techniques to reduce leakage current for the standby operation of cache are called dynamic Vt SRAM and Data Retention Gated-Ground-Cache (DRG-Cache). Dynamic Vt SRAM increases the threshold voltage by body biasing. However, this technique is relatively costly because of the twin well process. Plus, Vt SRAM has reliability problems. The DRG-Cache approach has problems as well. To retain data of cache in standby mode, DRG-Cache requires proper sizing of the gated-ground transistor and requires a sensitive threshold voltage level. The DRG-Cache approach also has a drawback when the cache is in standby mode. When in standby mode, the DRG-Cache technique cuts off the gated ground n-MOS, potentially destroying data written into the SRAM cells. Additionally, the DRG-Cache technique requires a larger decoder to provide sufficient power for driving an extra resistive-capacitive (RC) load for the gated-ground n-MOS.

Designers recently proposed yet another technique for leakage reduction, referred to as N-Controlled SRAM (NC-SRAM). This approach utilizes two extra power supplies for creating an alternating virtual ground that switches between low and high. A circuit according to this technique has the ability to store data when cache is in the standby mode, with the read-write access times not affected significantly. However, this technique seems to require additional power supply hardware and introduces leakage current between the power supply and ground, as well as the power loop in the power grid.

What are needed are alternative methods, circuit apparatuses, and techniques to reduce leakage current without making circuits more susceptible to noise, without unduly increasing fabrication costs, and without requiring large amounts of additional circuit hardware.

SUMMARY

The problems identified above are in large part addressed by virtual power rails to decrease power consumption and leakage current in integrated circuits, which include processor integrated circuits. One embodiment comprises a method to reduce leakage current in integrated circuits. The method generally involves generating two voltages at two nodes coupled to two voltage potential devices and supplying power to an integrated circuit from the two voltages. In some embodiments, the voltage potential devices comprise p-type and n-type transistors operated in near cutoff states to control the voltages of the two nodes. An alternative embodiment includes SRAM circuits as the loads, wherein the two voltages of the nodes create virtual power rails.

Another embodiment comprises an apparatus to reduce leakage current in an integrated circuit. The apparatus generally comprises using one or two circuit devices to create two voltage nodes for supplying power to a load of an integrated circuit. One embodiment of the apparatus may use an n-FET as one of the circuit devices to create one of the two voltages. Another embodiment of the apparatus may use a p-FET as one of the circuit devices to create one of the two voltages. Some embodiments comprise using the p-FET and n-FET elements to reduce leakage current in SRAM circuits, including 6T-SRAM cells. Some embodiments include using Vdd and Vss as power supply sources.

A further embodiment is a system with virtual devices operated in a manner to reduce leakage current when supplying an electrical load of the system. The system comprises a power supply, a virtual power device, one or more electrical loads, and the virtual ground device. Some embodiments of the system use a p-MOS transistor as the virtual power device, to generate or control the voltage of a virtual supply node coupled to the electrical loads. Some embodiments use an n-MOS transistor as the virtual ground device, to control the voltage or potential of a virtual ground node. Some embodiments may reduce leakage current in memory devices, such as SRAM and cache memory circuits, while other circuits may reduce leakage current for integrated circuit logic gates and circuits used for digital signal processing. Some embodiments may exist as cellular telephones or portable computing devices, while other embodiments may exist as desktop and rack-mounted computing devices.

A further embodiment is implemented as a computer program used to make or fabricate one or more integrated circuits, wherein the integrated circuit has virtual potential devices to reduce leakage current associated with a load of the integrated circuits. The program generally creates an integrated circuit load and couples one or more virtual potential devices to the load. The virtual potential devices may be coupled to a power supply and control one or more voltages supplying power to the integrate circuit loads.

BRIEF DESCRIPTION OF THE DRAWINGS

Aspects of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods, apparatuses, and techniques to decrease power consumption and reduce leakage current in integrated circuits are disclosed. New leakage power saving schemes for various types of integrated circuits, including cache memory circuits, that eliminate unnecessary static and dynamic power consumption yet do not sacrifice circuit throughputs or latencies are discussed. Embodiments comprise methods and apparatuses to reduce power consumption in integrated circuits by using virtual voltage rails, or virtual power rails, to supply power to integrated circuit loads. The methods generally involve using one or two virtual power control devices to "head" and "foot", or sandwich, the integrated circuit loads from firm power supply rails. In these method embodiments, one or more elements sense the voltage of the virtual power rails, or nodes, and make adjustments to control the voltage at certain potentials. While controlling the voltage in this manner, the virtual power control devices may serve to restrict leakage current flow through the integrated circuit loads.

While portions of the following detailed discussion describe many embodiments comprising field effect transistors (FETs) and other metal oxide semiconductor (MOS) devices, upon review of the teachings herein, a person of ordinary skill in the art will recognize that the following invention may be practiced and applied using a variety of integrated circuit devices, such as bipolar junction transistors (BJTs) and other MOS devices. All methods and apparatuses of practicing the invention are interchangeable. Further, some discussions for embodiments describe controlling the voltage potentials of rails while other embodiments describe controlling the voltage potential of nodes. Additionally, some discussions use the term "couple", while other terms use the word "connect". One of ordinary skill in the art will recognize that such terms are often interchangeable and mean very similar things. Such terms as these and others should be considered to be substituted for the described elements when employed in accordance with similar constraints to perform substantially equivalent functions.

Figure 1A:
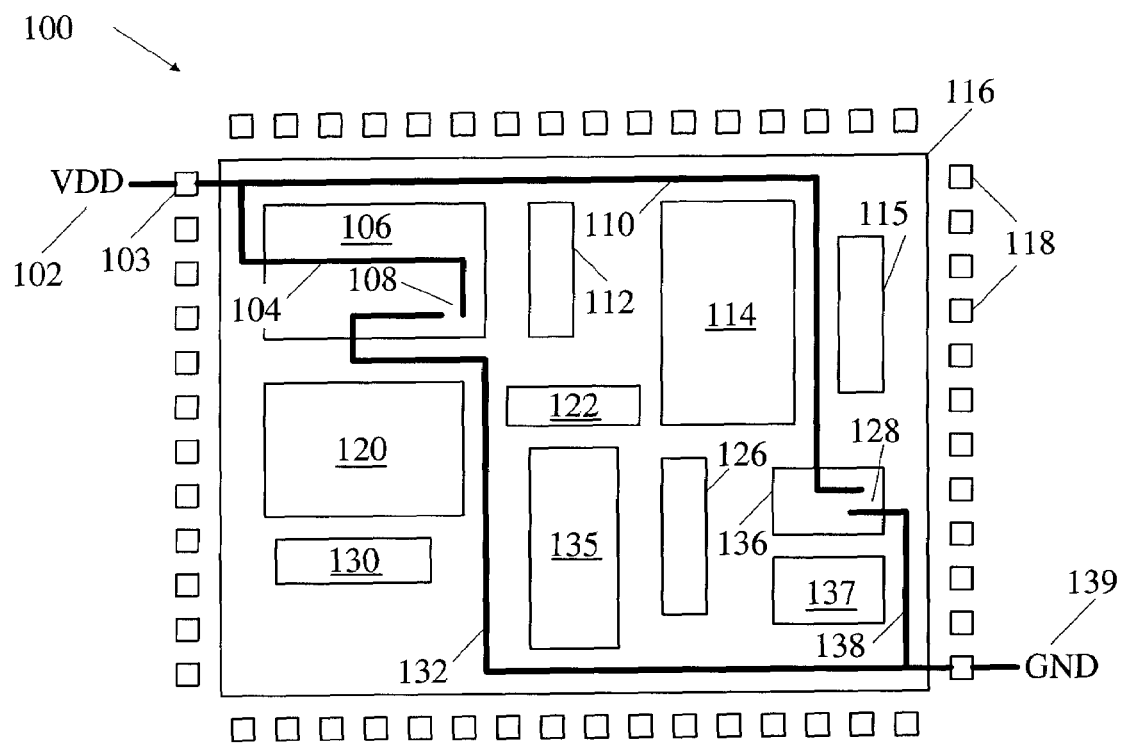
FIG. 1A depicts a system comprising an application specific integrated circuit having a central processing unit, memory, gate arrays, and an input-output control block which may employ self-controlled virtual power rails to reduce leakage current.

Turning to the drawings, FIG. 1A illustrates how a system 100 may benefit from methods and apparatuses described herein for reducing leakage current and power consumption in integrated circuits (ICs). As depicted in FIG. 1A, system 100 may be an ASIC created using a semiconductor substrate 116. System 100 may be divided into numerous functional areas and comprise numerous components, such as a central processing unit (CPU) 106, random access memory 114, cache 122, peripheral input-output 120, and an input-output (I/O) block 135. System 100 may comprise components for translating digital and analog signals, such as an analog-to-digital (A/D) converter 137 and a digital-to-analog (D/A) converter 136. For example, system 100 may be an ASIC for a cellular telephone, with A/D converter 137 and D/A converter 136 translating analog signals to and from a speaker and a microphone of the cellular telephone.

System 100 may also comprise numerous gate arrays located in various areas of the integrated circuit, such as gate array 112, gate array 126, as well as gate arrays 130 and 115. Such gate arrays may be used in the ASIC to perform simple computations or logic functions outside the CPU 106, working in conjunction with other blocks, such as peripheral input-output block 120 or I/O block 135. Additionally, some or all of such gate arrays may comprise uncommitted gate array cells added to enable engineers to make design changes or to fill empty integrated circuit surface areas.

Numerous I/O pads 118 may be located around the periphery of semiconductor substrate 116, providing connection terminals for outside power and signal lines to system 100. As depicted in FIG. 1A, a power supply system voltage VDD 102 may be terminated on I/O pad 103 and be distributed throughout system 100 by numerous metal traces. For example, metal trace 104 may supply system voltage VDD 102 to the CPU 106 and metal trace 110 may supply system voltage VDD 102 to the D/A converter 136. Likewise, a system ground 139 may be terminated and distributed to the D/A converter 136 and the CPU 106 by metal trace 138 and metal trace 132, respectively.

System 100 may be developed and created using a deep submicron process. Additionally, system 100 may operate using one or more reduced threshold voltages. For example CPU 106, random access memory 114, and cache 122 may operate using a reduced threshold voltage, while the other components in system 100 may operate at a higher voltage, such as VDD 102. Alternatively, all components in system 100 may operate using reduced threshold voltages. With a reduced metal oxide semiconductor (MOS) threshold voltage, the manufacturer and/or designer may face increased sub-threshold leakage current and excessive power dissipation. As a result, the designer may utilize a technique which may be described as Self-Controlled Virtual Power (SCVP) creation. The designer may utilize SCVP to reduce leakage current for such elements as cache 122 and the CPU 106 in system 100, as well as any other elements that system 100 may have.

The designer of system 100 may utilize SCVP to create virtual power rails in order to reduce leakage current. For example, metal trace 104 and metal trace 132 may supply system voltage VDD 102 and system ground 139, respectively, to a section 108 of the CPU 106. Similarly, metal trace 110 and metal trace 138 may supply system voltage VDD 102 and system ground 139, respectively, to a section 128 of the D/A converter 136. At sections 108 and 128 of the CPU 106 and the D/A converter 136, the designer may want to reduce leakage current by employing SCVP. For example, the designer may implement one or more Leakage Control Transistors (LCTs) to push down the voltage of supply system voltage VDD 102 and pull up the potential of system ground 129 to desired levels at sections 108 and 128. The designer may connect the LCTs in a way such that the LCTs operate in near cutoff modes after the virtual power rails are saturated. Operating the LCTs in this manner may significantly reduce the leakage current. The voltage potentials of the virtual power rails may be set symmetrically to a middle power level VDD/2 by selecting proper LCTs. The virtual power rails may provide differential voltage outputs instead of the voltages of supply system voltage VDD 102 and system ground 139. For example, with the LCTs operating in near cutoff conditions, they may provide stable differential outputs for sections 108 and 128.

Figure 1B:
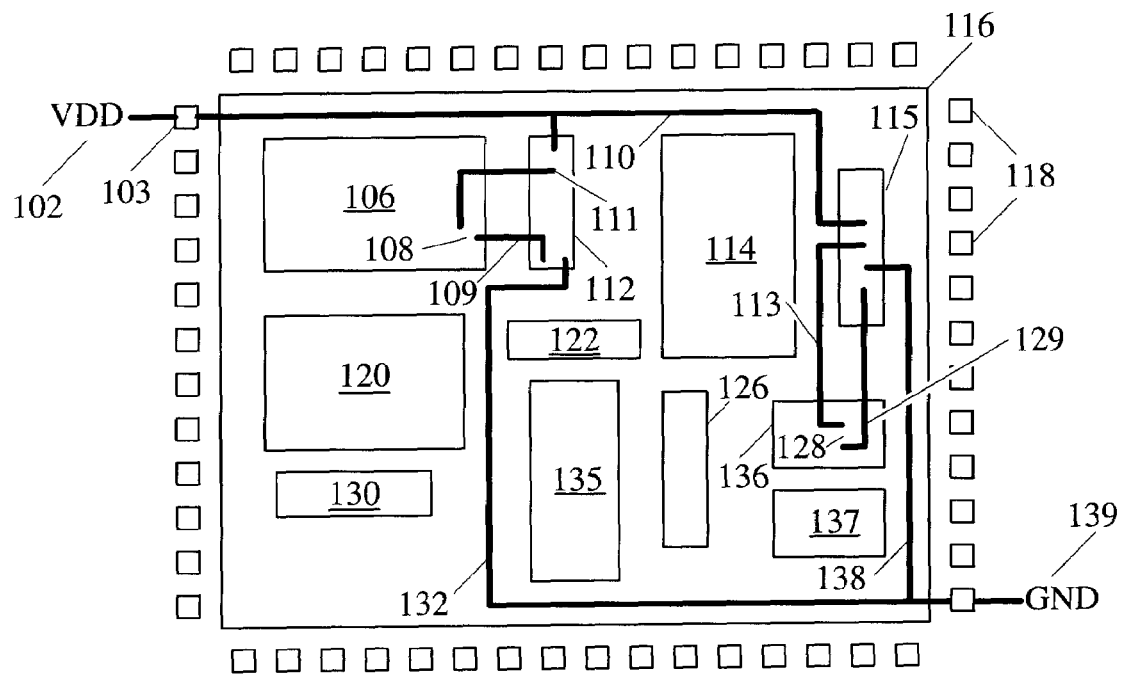
FIG. 1B depicts how a gate array of field effect transistors may be utilized to reduce leakage current in an existing integrated circuit design.

One potential benefit of SCVP may be realized by examining FIG. 1B. FIG. 1B illustrates how previously uncommitted or partially unused structures within gate arrays 112 and 115 may be modified to create SCVP rails in system 100, according to various embodiments, and help reduce leakage current. Gate array 112 may be modified to create SCVP rails for the CPU 106 and gate array 115 may be modified to create SCVP rails for the D/A converter 136. For example, a designer can route supply system voltage VDD 102 and system ground 139 to gate arrays 112 and 115. Once routed to gate arrays 112 and 115, the designer can land them on individual terminals of p-type and n-type transistors. For example, the designer may land them on p-type field effect transistors (p-FETs) and n-type field effect transistors (n-FETs). Upon proper configuration of the p-FETs and n-FETs, the transistors may create SCVP power rails. The designer may route the virtual power created by these FETs to sections 108 and 128 of the CPU 106 and the D/A converter 136 using metal traces 111, 109, 113, and 129. Creating SCVP using non-personalized or previously unconfigured gate array cells may allow designers and manufacturers to retrofit or modify existing circuits with significantly reduced design effort by preventing the need for lower die redesign, only requiring changes to the upper level metallization layers. In other words, back-end-of-line (BEOL) techniques may be utilized to reduce leakage current at a very late stage in the design process.

In alternative embodiments, system 100 may be a CPU, or a high performance processor. In further embodiments, system 100 may comprise a microcontroller or another type of integrated circuit. Additionally, in other embodiments single or multiple parts of the integrated circuit may benefit from SCVP. In order to illustrate how one may utilize LCTs and other elements to reduce leakage in a specific type of device of an integrated circuit, we turn now to FIG. 2A.

Figure 2A:
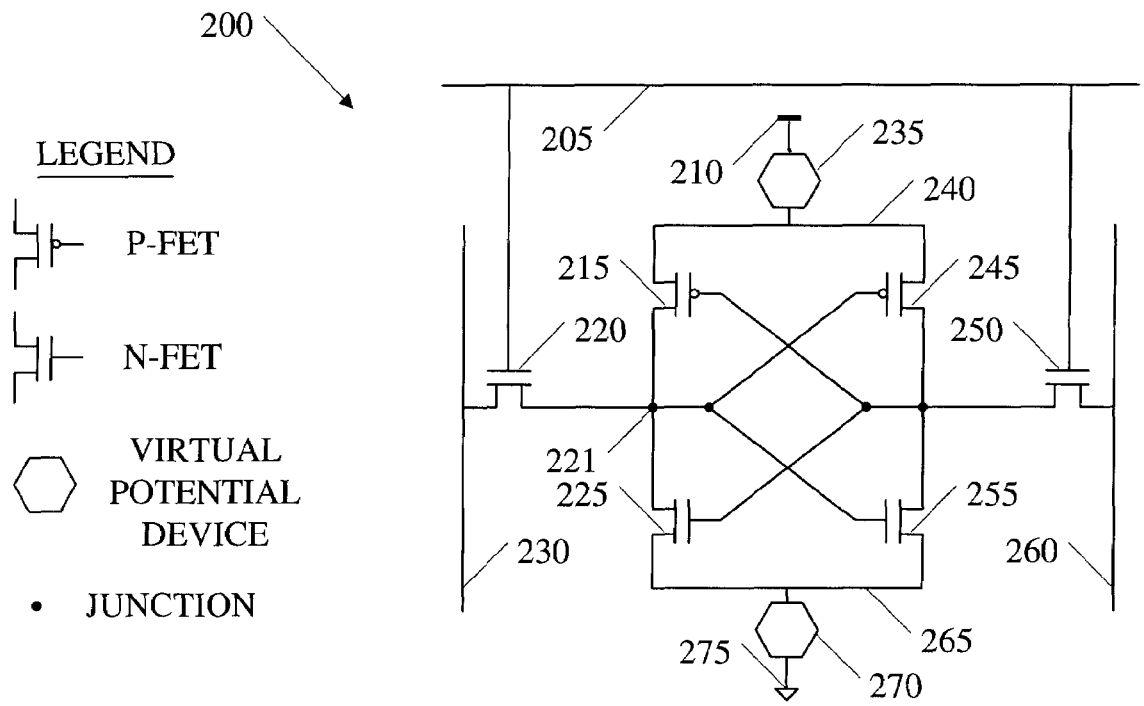
FIG. 2A depicts a 6T-SRAM cell employing two virtual potential devices to reduce leakage current and conserve power consumption of the cell.

FIG. 2A shows an embodiment of a 6T-SRAM cell 200 arranged to implement SCVP rails and reduce leakage current. 6T-SRAM cell 200 may be powered from a positive voltage source 210 and a ground source 275. For example, positive voltage source 210 may comprise Vdd for an integrated circuit, while ground source 275 may comprise Vss. 6T-SRAM cell 200 has word line 205 which may be sent logically high to enable n-FET 220, n-FET 250, and consequently 6T-SRAM cell 200. That is to say, when word line 205 is high, precharged bit line 230 and inverse bit line 260 may cause 6T-SRAM cell 200 store a 1 bit or a 0 bit.

If 6T-SRAM cell 200 were operated without the benefit of SCVP rails, 6T-SRAM cell 200 may have three significant leakage currents. When node 221 is low, a first leakage current may flow from positive voltage source 210 to ground source 275 through p-FET 215 and n-FET 225. A second leakage current may flow through n-FET 220 and n-FET 225. A third leakage current may flow through p-FET 245 and n-FET 255.

6T-SRAM cell 200 may have a first virtual potential device 235 and a second virtual potential device 270 that may serve to reduce leakage current in 6T-SRAM cell 200, such as the leakage currents mentioned above through p-FET 215, n-FET 225, n-FET 220, p-FET 245, and n-FET 255. Virtual potential device 235 may be coupled to positive voltage source 210, arranged to sense and control a voltage of a virtual supply node 240 at a voltage slightly lower than positive voltage source 210. Virtual potential device 270 may sense and control a voltage of a virtual supply node 265 at a voltage slightly higher than the potential of ground source 275. Inserting virtual potential devices 235 and 270 may cause 6T-SRAM cell 200 to become "headed and footed". In other words, virtual potential devices 235 and 270 may isolate virtual supply nodes 240 and 265 from positive voltage source 210 and ground source 275. This isolation from positive voltage source 210 and ground source 275, as well as the throttling functions performed by virtual potential devices 235 and 270 may serve to reduce leakage currents in 6T-SRAM cell 200. To illustrate a specific embodiment of this technique for a 6T-SRAM cell, we turn now to FIG. 2B.

Figure 2B:
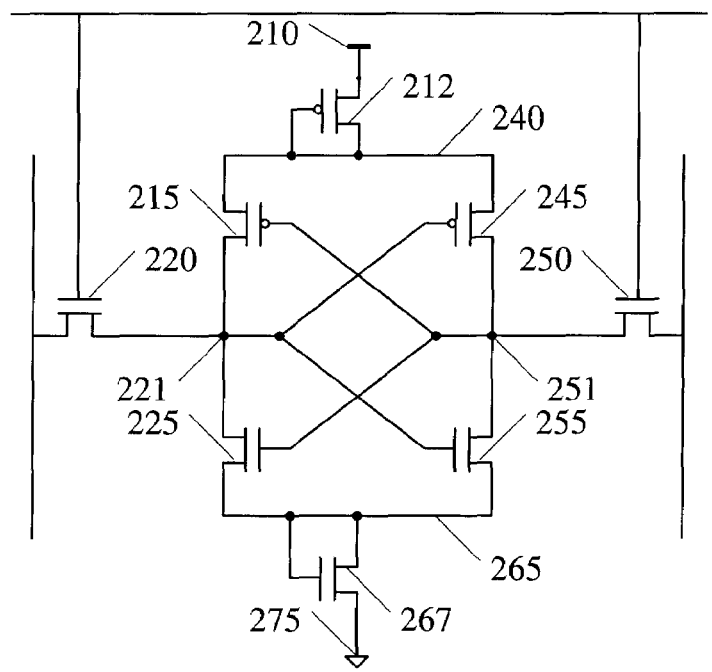
FIG. 2B illustrates a specific embodiment of a 6T-SRAM cell employing a p-FET and an n-FET to reduce leakage current.

FIG. 2B shows a particular embodiment, having a couple of modifications, of 6T-SRAM cell 200 depicted in FIG. 2A. In particular, FIG. 2B shows a 6T-SRAM cell 280 with a p-FET 212 for a first voltage potential device. A drain terminal of p-FET 212 may attach to positive voltage source 210 while a source terminal of p-FET 212 may attach to virtual supply node 240. 6T-SRAM cell 280 also has an n-FET 267 for a second virtual potential device. A source terminal of n-FET 267 may attach to ground source 275 while a drain terminal of n-FET 267 may attach to virtual supply node 265. One may note that p-FET 212 and n-FET 267 may serve as Leakage Control Transistors (LCTs) in a common leakage path between positive voltage source 210 and ground source 275.

One will note that a gate of p-FET 212 is connected to virtual supply node 240 and that a gate of n-FET 267 is connected to virtual supply node 265. After saturation of virtual supply node 240 and virtual supply node 265, p-FET 212 and n-FET 267 may operate in near cutoff states. In particular, if one denotes the voltage potential of virtual supply node 240 as Vv and the voltage potential of virtual supply node 265 as Vg, their voltage potentials may be determined by proper sizing of p-FET 212 and n-FET 267. When configured as shown in FIG. 2B, the virtual voltage levels may be robust, with the proper transistor sizes relatively easy to obtain. Assuming positive voltage source 210 is equal to Vdd, and once p-FET 212 and n-FET 267 are driven to their saturation levels, the following equations may calculate the voltage potentials Vv and Vg for virtual supply nodes 240 and 265: Vv=Vdd−Vdesired and Vg=Vdesired, where Vg is the desired virtual ground which may be slightly greater than the threshold voltage. Sizing p-FET 212 and n-FET 267 in this manner, with the potentials Vv and Vg for virtual supply nodes 240 and 265, respectively, may produce conditions of near cutoff for p-FET 212 and n-FET 267 and cut down leakage currents in 6T-SRAM 680.

The operation of p-FET 212 and n-FET 267, in controlling the voltage potentials for virtual supply nodes 240 and 265 of 6T-SRAM cell 280, may be better understood by a detailed description. Once power is applied to the integrated circuit for 6T-SRAM cell 280, positive voltage source 210 may be charged up to Vdd, relative to ground source 275. Assuming the integrated circuit for 6T-SRAM cell 280 has been de-energized for a long time, virtual supply node 240 and virtual supply node 265 may each have a potential of zero volts. Since the gate and the source terminal for p-FET 212 are connected to virtual supply node 240, the gate will also be low immediately after power-up. With the gate of p-FET 212 low, its source terminal low, and its drain terminal high, p-FET 212 will be forward biased allowing virtual supply node 240 to be pulled up near the potential of positive voltage source 210. As the voltage of virtual supply node 240 approaches and the voltage of positive voltage source 210, the gate of p-FET 212 may be pulled up and pinch or turn off p-FET 212, causing it to be reverse biased.

During operation, p-FET 215, p-FET 245, and n-FETs 225 and 255 may consume power and pull the voltage of virtual supply node 240 down. As the potential of virtual supply node 240 goes down, the gate potential of 212 will also drop and start to open up p-FET 212, allowing the potential of virtual supply node 240 to be pulled back up closer to positive voltage source 210. As the potential of virtual supply node 240 increases, p-FET 212 may quickly return back to its near cutoff state. This throttling action may allow p-FET 212 to control and maintain the voltage of virtual supply node 240 at a voltage slightly lower than positive voltage source 210.

Similar to the operation of p-FET 212, n-FET 267 may throttle to control the voltage of virtual supply node 265. After power-up, virtual supply node 265 may be zero volts. As p-FET 215, p-FET 245, and n-FETs 225 and 255 operate, the voltage potential of virtual supply node 265 may start to be pulled up. However, as the voltage of virtual node 265 increases, so too will the voltage applied to the gate of n-FET 267. While n-FET 267 will still remain in the near cutoff state, applying a more positive voltage to its gate will cause it to open up and pull the voltage of virtual supply node 265 back down near the voltage potential of ground source 275. As one may note, the total sub-threshold current may be the sum of the currents in p-FET 212 and n-FET 267. In light of this, one may see that the dual virtual power rail architecture may provide significantly appreciable double leakage prevention.

If 6T-SRAM cell 280 did not have p-FET 212 and n-FET 267 to control the voltages of virtual supply nodes 240 and 265, respectively, 6T-SRAM cell 280 might otherwise be directly pulled down and pulled up by positive voltage source 210 and ground source 275 through p-fets 215 and 245 and n-fets 225 and 255. This would be how 6T-SRAM cell 280 may store data as long as power is applied to the integrated circuit. In contrast, 6T-SRAM cell 280 as depicted in FIG. 2B is sandwiched by virtual supply nodes 240 and 265 having voltage levels slightly less than "1" and slightly greater than "0", respectively.

Having voltage nodes or voltage rails that are not directly connected to positive voltage source 210 and ground source 275, one may conclude that 6T-SRAM cell 280 has a floating power rails. Since data retention may most likely be a serious issue, one may have a concern about whether creating virtual supply nodes 240 and 265 makes it easier for a noise source to alter the "0" node (either node 221 or node 251) to a "1", and vice versa. Noise should not be problem, as p-FET 212 and n-FET 267 may have appreciably significant ability to discharge "0" and charge "1", as compared to the rest of the FETs in 6T-SRAM cell 280, because p-FET 212 and n-FET 267 operate near cutoff and the current that goes through them is at the voltage level where $VGS-Vt=0^+$. When node 221 is at the voltage of virtual supply node 265, node 221 is saturated by two charging current flows through p-FET 215 and n-FET 220 but has a discharge current flow through n-FET 267. Consequently, node 221 may stay firm at the voltage of virtual supply node 265, not having the potential to alter the stored data in 6T-SRAM cell 280 while in standby mode.

One should note that SCVP devices, such as 6T-SRAM cell 280 and other 6T-SRAM cells that may be placed in parallel with it, may have a reduced span of power rails. Consequently, the stored data may not be firmed at "0" and "1". SCVP devices may be squeezed instead. SCVP devices may differ, therefore, from such devices as DRG-cache where a gated ground transistor is totally cutoff when the cache is in standby mode. As such, when a read occurs SCVP devices may need to discharge virtual node 265 to a firm ground. Therefore one may expect a delay for a data read from 6T-SRAM cell 280. However, 6T-SRAM cell 280 should not have such a delay for the data read from 6T-SRAM cell 280. Consequently, performance of a system containing 6T-SRAM cell 280 may not be degraded by operating with the reduced power rail span.

While the embodiments in FIG. 2A and FIG. 2B are depicted as 6T-SRAM cells, other embodiments may control the voltage of virtual supply nodes 240 and 265 for other types of devices. For example, virtual supply nodes 240 and 265 may supply power to one or more 4T-SRAM cells, or one or more 1T DRAM cells. In various embodiments, the devices powered by virtual supply nodes 240 and 265 may be memory devices, such as cache and other types of memory, or the devices may be other types of MOS devices. Further, some alternative embodiments may comprise sense amplifies and regenerative amplifiers. Additionally, some embodiments may include bit line multiplexing for bit line 230 and inverse bit line 260. Even further, SRAM cells fed by virtual supply nodes 240 and 265 may comprise dual-port SRAM cells, including full dual-port SRAM cells.

Figure 3:
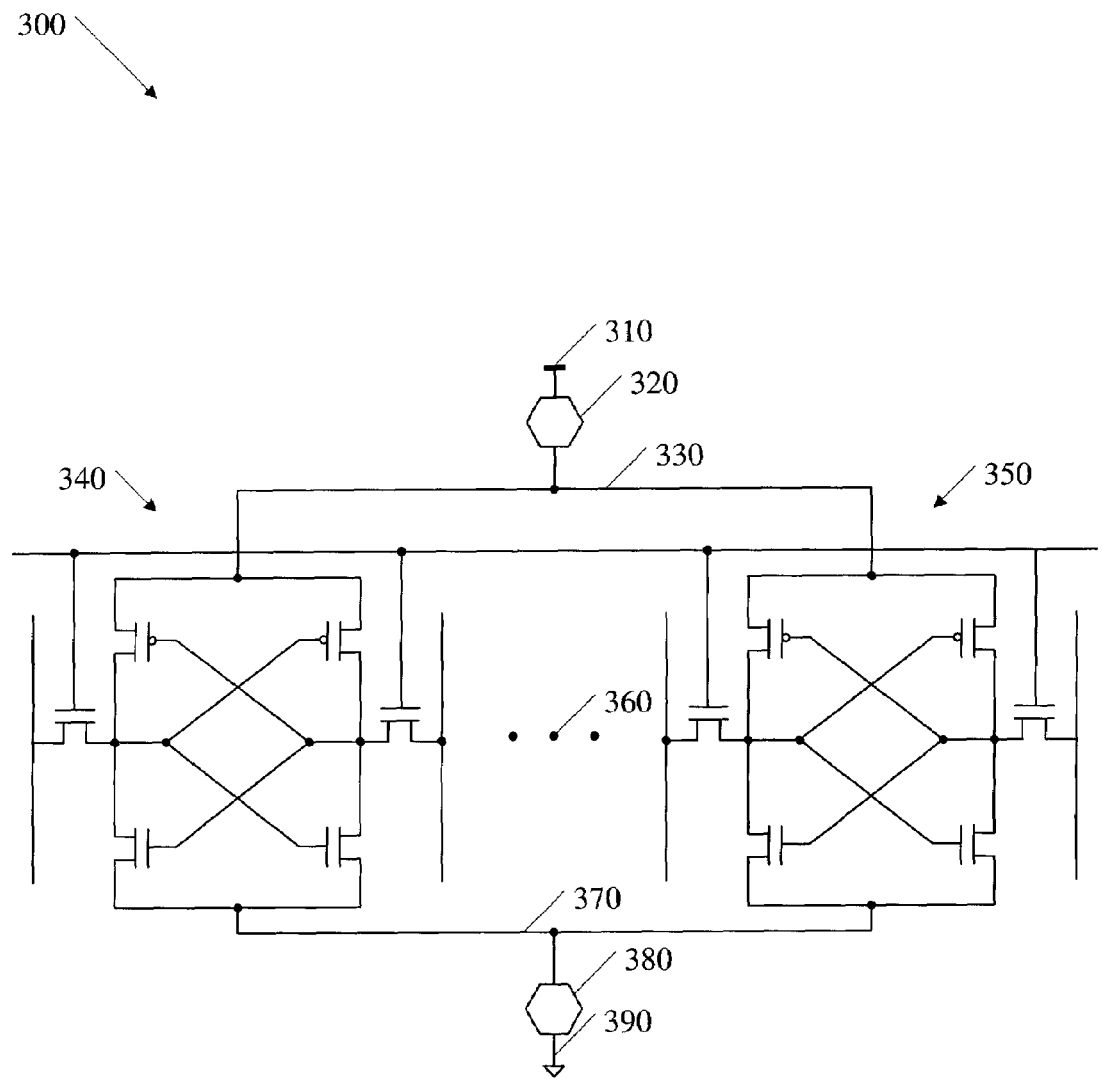
FIG. 3 shows an embodiment of a 6T-SRAM cache block employing two virtual power control devices to reduce leakage current and power consumption.

As alluded to earlier, FIG. 3 shows an alternative embodiment of where SCVP rails may supply power to a plurality of memory devices and still reduce leakage power for the devices. FIG. 3 depicts what may be an embodiment of a 6T-SRAM cache block 300. 6T-SRAM cache block 300 may comprise a number of 6T-SRAM cells, such as 6T-SRAM cell 340 and 6T-SRAM cell 350. Continuation dots 360 imply that 6T-SRAM cache block 300 may comprise varying numbers of 6T-SRAM cells. To supply power to 6T-SRAM cell 340 and 6T-SRAM cell 350, a first virtual power control device 320 may control the voltage of a first power rail 330 relative to a supply voltage 310. 6T-SRAM cell 340 and 6T-SRAM cell 350 may derive a virtual ground from a virtual ground rail 370. A second virtual power control device 380 may control the voltage of virtual ground rail 370 at a voltage slightly above a local ground 390.

Similar to 6T-SRAM cell 200 depicted in FIG. 2A, 6T-SRAM cell 340 and 6T-SRAM cell 350 may be "headed and footed" by virtual power control device 320 and virtual power control device 380, respectively. Also similar to FIG. 2B, virtual power control device 320 and virtual power control device 380 may comprise p-MOS and n-MOS devices to effectively reduce the leakage current of 6T-SRAM cache block 300 comprising 6T-SRAM cell 340 and 6T-SRAM cell 350, as well as other 6T-SRAM cells in parallel with them. Virtual power control device 320 and virtual power control device 380 may reduce leakage current of standby cache 6T-SRAM cell 340 and 6T-SRAM cell 350, when virtual power control devices 320 and 380 act as double barriers to block the leakage current flowing between supply voltage 310 and local ground 290.

Again, virtual power device control 320 and virtual power control device 370 may control the voltages of power rail 330 and virtual ground rail 370 at desired levels. For example, similar to p-FET 212 and n-FET 267 in the embodiment of FIG. 2A, virtual power control device 320 and virtual power control device 380 may comprise p-MOS and n-MOS circuit elements. The virtual rails, power rail 330 and virtual ground rail 370, may gate or throttle the p-MOS and n-MOS circuit elements to create and keep a near cutoff condition for the elements. For a given technology, such as a 65 nm technology, the voltage levels of power rail 330 and virtual ground rail 370 may linearly depend on the dimensions of the p-MOS and n-MOS circuit elements, so that the voltage levels may be determined relatively easily.

Figure 4:
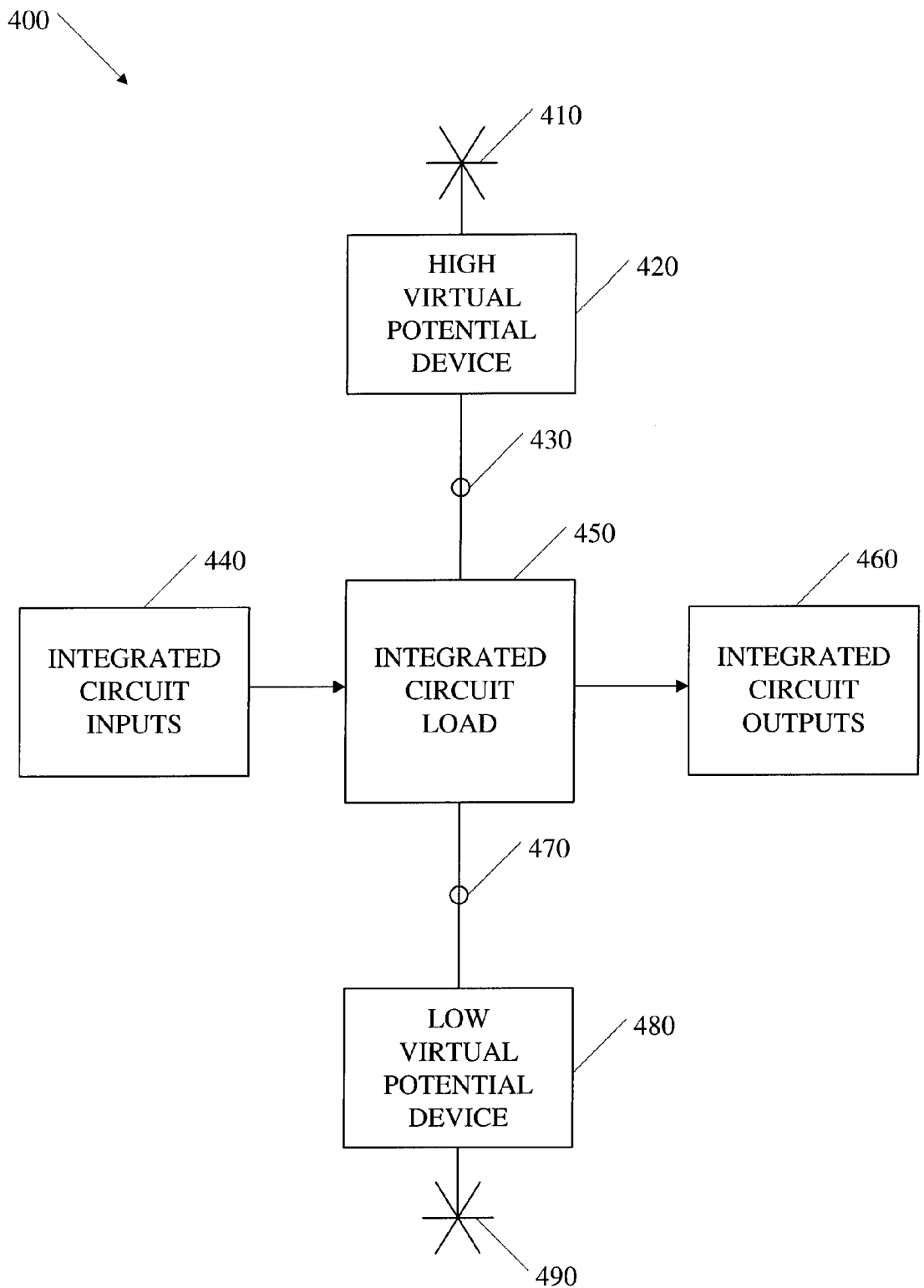
FIG. 4 illustrates an apparatus to reduce leakage current for an integrated circuit load, where the integrated circuit load may have numerous integrated circuit inputs and outputs.

Turning now to FIG. 4, we see an embodiment of an apparatus 400 to reduce leakage current for an integrated circuit load 450. Apparatus 400 may have a first voltage connection 410 supplying power to a high virtual potential device 420. Apparatus 400 may also have a second voltage connection 490 connected to a low virtual potential device 480. Using the voltage potential difference created between voltage connection 410 and voltage connection 490, high virtual potential device 420 may create a first voltage node 430. Also using the voltage potential difference created between voltage connection 410 and voltage connection 490, low voltage potential device 480 may create a second voltage node 470.

The magnitude of the voltages created by high virtual potential device 420 and low virtual potential device 480, as well as the voltage potential applied to voltage connections 410 and 490, may vary in different embodiments. For example, in some embodiments, apparatus 400 may be an integrated circuit device created using 65 nm technology. Apparatus 400 may be connected to a potential difference of 1.05 volts, as measured between voltage connection 410 and voltage connection 490. In such an embodiment, high virtual potential device 420 and low virtual potential device 480 may create a voltage of 200 mV, as measured between voltage node 430 and voltage node 470. In other example embodiments, apparatus 400 may be connected to a potential difference of 3.3 volts and use high virtual potential device 420 and low virtual potential device 480 to create a voltage of 300 mV. Again, such voltage differences may vary from embodiment to embodiment and the voltages cited above being mere examples.

High virtual potential device 420 and low virtual potential device 480 may comprise different circuit elements in different embodiments. For example, high virtual potential device 420 may comprise a p-FET having its gate coupled to voltage node 430. Such an arrangement may be similar to p-FET 212 depicted in FIG. 2B. Connected in such a fashion, the p-FET comprising high virtual potential device 420 may control the voltage of voltage node 430 by sensing and responding to voltage changes of voltage node 430. Similarly, low virtual potential device 480 may comprise an n-FET having its gate coupled to voltage node 470 and control the voltage of voltage node 470 by sensing and responding to voltage changes of voltage node 470. In other embodiments, high virtual potential device 420 and low virtual potential device 480 may comprise more complex or different elements. As examples, low virtual potential device 480 may comprise a bipolar junction transistor, a unijunction transistor, or a zener diode.

In further embodiments, low virtual potential device 480 and high virtual potential device 420 may comprise other additional elements, such as resistors and capacitors. For example, high virtual potential device 420 may comprise a network containing an N-P-N type bipolar junction transistor, having its collector and emitter terminals coupled to voltage connection 410 and voltage node 430 through resistive elements. Additionally, a base of the N-P-N type bipolar junction transistor may be coupled to voltage node 430 via resistive elements as well, to monitor and control its voltage in a feedback fashion.

In different embodiments, high virtual potential device 420 and low virtual potential device 480 may comprise different combinations of devices. For example, high virtual potential device 420 may comprise a single p-FET while low virtual potential device 480 comprises a complex circuit having multiple transistors, resistors, and other devices. Also, in further embodiments, high virtual potential device 420 and low virtual potential device 480 may not be limited to single elements. For example, instead of low virtual potential device 480 comprising a single n-FET, it may comprise two or more n-FETs in series to increase the leakage resistance more than can be provided by a single transistor. In the case where low potential device 480 comprises two n-FETs in series, each n-FET may provide half of the voltage drop between voltage node 470 and voltage connection 490, or one n-FET may provide more of the voltage drop than the other.

In further embodiments, high virtual potential device 420 may comprise more than a single element. For example, high virtual potential device 420 may comprise two or more p-FETS operated in parallel. Such an arrangement may be necessary when integrated circuit load 450 comprises a large bank of cache memory elements that may exceed the current capability of a single p-FET.

One should note that integrated circuit inputs 440 and integrated circuit outputs 460 for apparatus 400 shown as separate components of apparatus 400. Integrated circuit inputs 440 and integrated circuit outputs 460 may comprise bit lines, word control lines, address lines, and data bus lines for integrated circuit load 450. Additionally, integrated circuit inputs 440 and integrated circuit outputs 460 may comprise additional signal processing circuitry to modify the input and output signals for integrated circuit load 450. For example, the block(s) representing integrated circuit inputs 440 and/or integrated circuit outputs 460 may step up or step down the voltage levels so that circuits external to apparatus 400 may properly send and/or receive such signals. Additionally, integrated circuit inputs 440 and integrated circuit outputs 460 may easily be combined with integrated circuit load 450. In other words, the blocks for integrated circuit inputs 440 and integrated circuit outputs 460 may be combined into the block representing integrated circuit load 450.

One should also note that while apparatus 400 has high virtual potential device 420 and low virtual potential device 480, alternative embodiments may not include both virtual potential devices. For example, one embodiment may comprise only a low virtual potential device 480 situated between voltage connection 490 and voltage node 470. High virtual potential device 420 and voltage node 430 may not exist. In such an embodiment, voltage connection 410 may be connected directly to integrated circuit load 450, or coupled to it via other passive circuit components, such as resistors and capacitors.

Figure 5:
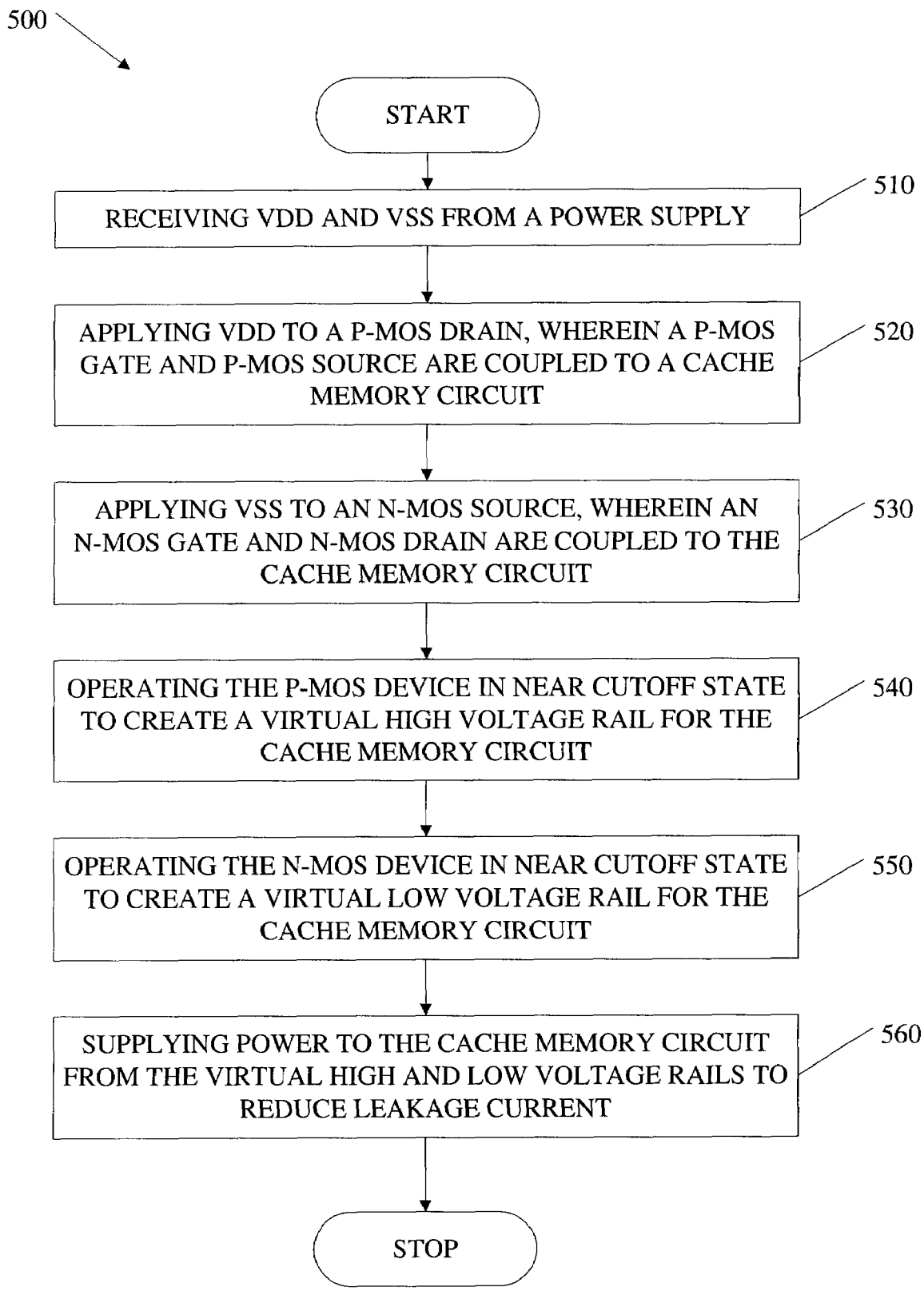
FIG. 5 depicts a flowchart of a method to decrease power consumption and leakage current in a cache memory circuit by utilizing p-MOS and n-MOS devices to control the voltages of high and low voltage rails.

FIG. 5 depicts a flowchart 500 illustrating an embodiment of a method to decrease power consumption and reduce leakage current in an integrated circuit. Flowchart 500 begins with receiving Vdd and Vss from a power supply (element 510). For example, Vdd and Vss may have a voltage difference of 1.03 volts and be provided to the integrated circuit through a connection pad of an integrated circuit package, or be provided by a metal trace from another part of the integrated circuit.

After receiving Vdd and Vss from the power supply (element 510), an embodiment according to flowchart 500 may continue by coupling a p-MOS drain to Vdd and coupling a p-MOS gate and source to a cache memory circuit (element 520). For example, the p-MOS gate and source may be coupled to a virtual high voltage rail for a bank of 6T-SRAM cells. Additionally, the embodiment may couple an n-MOS source to Vss and coupling an n-MOS gate and drain to the cache memory circuit (element 530). This may create a virtual low voltage rail for the bank of 6T-SRAM cells.

Upon coupling the p-MOS and n-MOS terminals (elements 520 and 530), a method according to flowchart 500 may continue by operating the p-MOS device in near cutoff state to create and control the virtual high voltage rail for the cache memory circuit (element 540). Similarly, the method of flowchart 500 may also operate the n-MOS device in near cutoff state to create and control the virtual low voltage rail for the cache memory circuit (element 550).

When operated in the manner described above, an integrated circuit according to the method of flowchart 500 may supply power to the cache memory circuit from the virtual high and low voltage rails to reduce leakage current (element 560). Worth emphasizing is the fact that the method described in flowchart 500 may be used to reduce leakage current in other types of integrated circuits as well, not just cache memory circuits.

Figure 6:
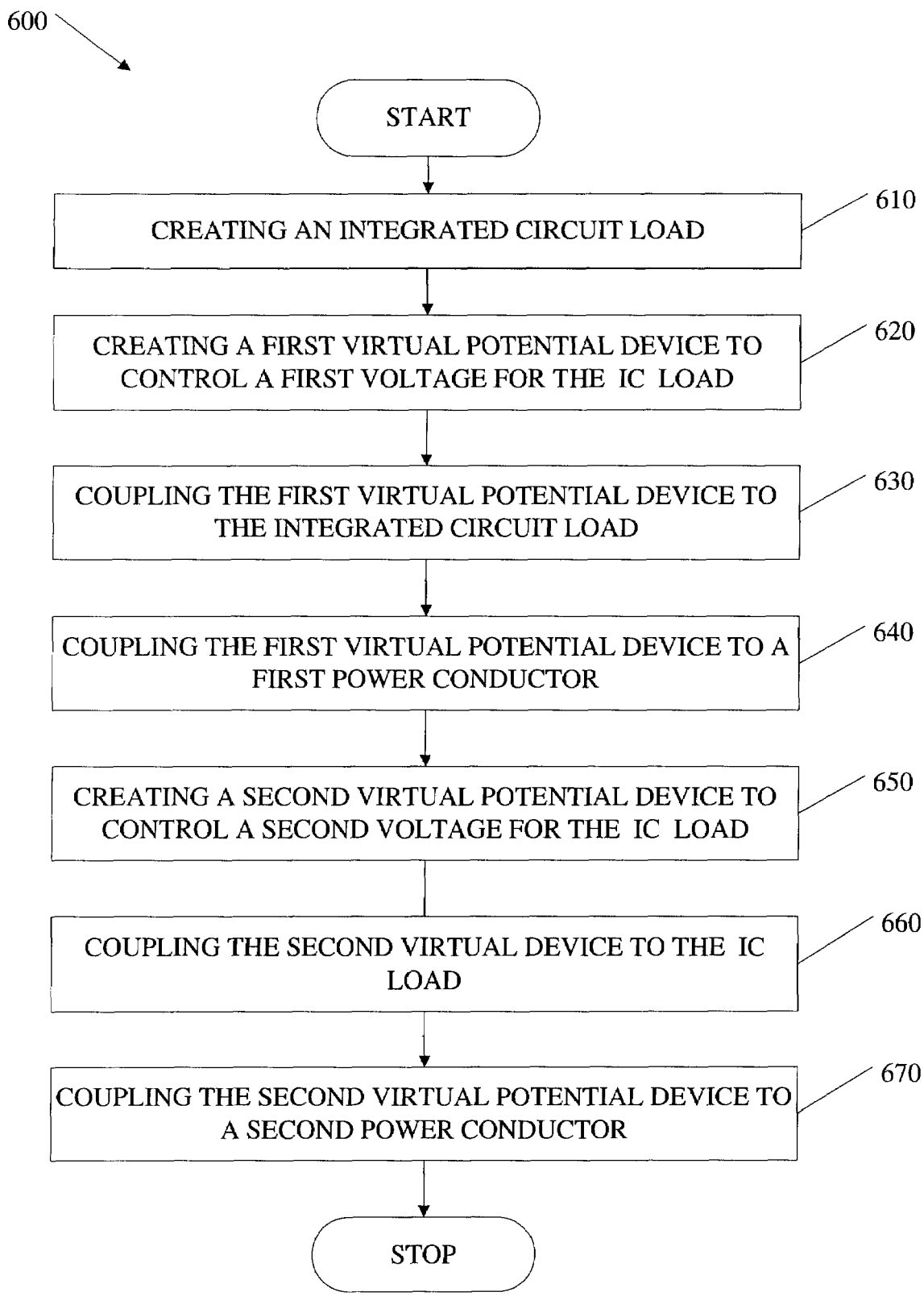
FIG. 6 depicts a flowchart of for a computer program embodiment that may make or fabricate one or more integrated circuits having virtual potential devices to reduce leakage current associated with a load of the integrated circuits.

We turn now to FIG. 6 which shows a flowchart for a computer program embodiment that may make or fabricate one or more integrated circuits having virtual potential devices. The virtual potential devices may reduce leakage current associated with a load of the integrated circuits. The program may be used by a computer and/or integrated circuit fabricating machine to create the integrated circuit load and couple one or more virtual potential devices to the load. The virtual potential devices created by the computer program may be coupled to a power supply and control one or more voltages supplying power to the integrated circuit loads.

A computer running the program may operate or control a machine that fabricates an integrated circuit layer by layer on a semiconductor substrate. The computer and machine may create a great number of semiconductor devices on the substrate, such as metal-oxide-semiconductor ("MOS") transistors, bipolar transistors, buffers, capacitors, resistors, and other devices that form the integrated circuit. The computer and machine, or fabricating system, may form integrated circuit devices using one or more levels of polysilicon. For example, the fabricating system may create a MOS transistor gate electrode or a resistor may from a layer of polysilicon.

The computerized fabricating system may create the integrated circuit layers through a sequence of pattern definition steps that are mixed with other process steps such as oxidation, etching, doping, and material deposition. The system may then deposit one or more metal layers on top of the base layers to form conductive segments that interconnect integrated circuit components. Formation of the metallization layers over the substrate may facilitate interconnection of the circuit devices to form more complex devices such as NAND gates, inverters, and the like. These metallization layers may also be used to provide power supply ground (Vss) and power supply voltage (Vdd) to the integrated circuit.

In many embodiments, the metallization layers created by the computerized fabrication system may utilize lines, contacts, and vias to interconnect transistors and other devices of integrated circuits which, as a whole, form the integrated circuits, such as processors, state machines, or memory devices. Lines in adjacent vertical layers may run perpendicular to one another, the adjacent vertical layers separated by a non-conductive passivation layer such as, e.g., silicon oxide. The computer program may operate the integrated circuit fabricating machine to etch silicon oxide and form the vias, which interconnect the lines of various metallization layers in accordance with the circuit design. The computer program may also bring inputs and outputs of the integrated circuit to a surface with vias to bond the circuits with pins of a chip package. The chip package may include an epoxy or ceramic that encloses the integrated circuit to protect the circuit from damage and pins to facilitate a connection between the inputs and outputs of the integrated circuit and, e.g., a printed circuit board.

A computer program embodiment according to flowchart 600 may be used by a circuit fabrication machine to create the semiconductor devices in and on the substrate by accomplishing the techniques and methods mentioned above, such as oxidation, etching, doping, and material deposition. For example, a computer program embodiment according to flowchart 600 may control the process of constructing an integrated circuit load using the semiconductor substrate (element 610). In different embodiments, the integrated circuit load will vary. For example, in some embodiments, the load may comprise a cache memory block. In other embodiments, the load may comprise an SRAM memory device.

The computer program may create or fabricate a first virtual potential device to control a first voltage for the integrated circuit load (element 620). The computer program may situate the first virtual potential device between the integrated circuit load and a power supply conductor (elements 630 and 640), so that the device may monitor and control a first voltage for the load (element 620). In other words, the device may be situated to supply the load with a voltage potential other than the power supply potential, so that the device may control the voltage that the load receives. For example, the device may be connected to a metal trace of the integrated circuit that supplies Vdd to other integrated circuit elements while the device will be arranged to supply the load with a different voltage slightly lower than Vdd.

The computer program may also create a second virtual potential device (element 650) and situate the device between the integrated circuit load and a second power supply conductor (elements 660 and 670). The second virtual potential device may be arranged to monitor and control a second voltage to the load. For example, the second device may be connected to another metal trace of the integrated circuit that supplies Vss to other circuit elements, while the device is arranged to supply the load with a second different voltage slightly higher than Vss.

A computer program embodiment according to flowchart 600 may create two virtual potential devices (elements 620 and 650). Such an embodiment may fabricate a circuit arranged like 6T-SRAM cell 200 shown in FIG. 2A, having virtual potential devices 235 and 270, for example. However, alternative embodiments may only create only one virtual potential device. Continuing with the example above, an alternative embodiment may create a 6T-SRAM cell having only virtual potential device 235 or virtual potential device 270, but not both.

One skilled in the art of integrated circuit design will readily appreciate the flexibility and benefits that the aforementioned example methods and apparatuses for decreasing power consumption and reducing leakage current of integrated circuits afford the fields of integrated circuit design and fabrication. The specifically described examples are only a few of the potential arrangements wherein the virtual power devices and virtual ground devices may be operated to control the voltages of voltage nodes and voltage rails and enhance power conservation in integrated circuits, without necessarily sacrificing speed or rapid operation of the integrated circuit.

It will be apparent to those skilled in the art having the benefit of this disclosure that the present invention contemplates methods, apparatuses, and systems that may decrease power consumption and reduce leakage current in integrated circuits. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Further, embodiments may achieve multiple objectives but not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method to reduce leakage current of an integrated circuit load, the method comprising:
    applying a first voltage to a first terminal of a single low potential device to create a low voltage at a low voltage node, wherein a second terminal and a third terminal of the single low potential device are coupled to the low voltage node,
    controlling the low voltage by the single low potential device, wherein the single low potential device senses the low voltage via the third terminal to control the low voltage, wherein further the single low potential device comprises a single-gate device;
    applying a second voltage to a high supply node, wherein the high supply node is coupled to the integrated circuit load; and
    supplying power to the integrated circuit load via the first voltage and the second voltage.

2. The method of claim 1, further comprising controlling a high voltage of a high voltage node by a single high potential device, wherein the single high potential device is coupled to the high supply node via a fourth terminal and coupled to the high voltage node via a fifth terminal and a sixth terminal.

3. The method of claim 2, wherein controlling the high voltage of the high voltage node by the single high potential device comprises operating a single p-type transistor in a near cutoff state to control the high voltage, wherein further the single p-type transistor comprises a single-gate transistor.

4. The method of claim 1, wherein controlling the low voltage by the single low potential device comprises continually operating a single n-type transistor in a near cutoff state to control the low voltage.

5. The method of claim 1, wherein generating a first voltage and generating a second voltage comprise creating virtual power rails for a plurality of SRAM circuits.

6. An apparatus to reduce leakage current in an integrated circuit, the apparatus comprising:
    at least one load of the integrated circuit coupled to a first node and a second node;
    a first lone transistor coupled to the first node and to a first voltage source, wherein the first lone transistor comprises a single-gate n-FET adapted to sense a low voltage of the first node and control the low voltage based on the sensing, wherein further the low voltage is to be positive relative to the first voltage source, wherein the n-FET source terminal is coupled to the first voltage source and the n-FET gate terminal and the n-FET drain terminal are coupled to the first node; and
    a second voltage source coupled to the second node, wherein the second node is to be at a high voltage when the integrated circuit is operated, wherein further the high voltage is to be positive relative to the low voltage.

7. The apparatus of claim 6, further comprising a second circuit device coupled to the second node and to the second voltage source, wherein the second circuit device is adapted to control the high voltage.

8. The apparatus of claim 7, wherein the second circuit device comprises a p-FET with a p-FET drain coupled to the second voltage source and with a p-FET gate and a p-FET source coupled to the second node.

9. The apparatus of claim 8, wherein the at least one load comprises at least one SRAM memory device.

10. The apparatus of claim 9, wherein the at least one SRAM memory device comprises at least one 6T-SRAM cell.

11. The apparatus of claim 8, wherein the first voltage source comprises a power supply Vss and the second voltage source comprises the power supply Vdd.

12. The apparatus of claim 8, wherein the single-gate n-FET and the p-FET are configured to symmetrically set the power level of the at least one load to a middle power level VDD/2.

13. A system, comprising:
    a power supply;
    a virtual power device coupled to a supply voltage node of the power supply, wherein the virtual power device comprises a singular transistor arranged to provide a supply voltage for a virtual supply node, wherein further the singular transistor comprises a single-gate transistor;

at least one electrical load coupled to the virtual supply node and a virtual ground node; and a virtual ground device coupled to the virtual ground node and to a ground node of the power supply, wherein the virtual ground device comprises a second singular transistor arranged to sense a low voltage of the virtual ground node and control the low voltage based on the sensing, wherein further the second singular transistor comprises a second single-gate transistor.

14. The system of claim 13, wherein the virtual power device is a p-MOS transistor with the drain terminal of the p-MOS transistor coupled to the supply voltage node and with the gate terminal and the source terminal of the p-MOS transistor coupled to the virtual supply node, wherein further the virtual ground device is an n-MOS transistor with the gate terminal and the drain terminal of the n-MOS transistor coupled to the virtual ground node and with the source terminal of the n-MOS transistor coupled to the ground node.

15. The system of claim 13, wherein the at least one electrical load comprises one of SRAM memory, cache memory, integrated circuit logic gates, and digital signal processing circuitry.

16. The system of claim 13, wherein the system comprises one of a cellular telephone, a portable computing device, a desktop computer, and a rack-mount computing device.

17. A computer program product comprising a computer usable medium having computer usable program code for creating an integrated circuit, the computer program product including;

computer usable program code for creating an integrated circuit load;

computer usable program code for coupling a first virtual potential device to the integrated circuit load, wherein the first potential device comprises a singular transistor adapted to monitor and control a first voltage to be supplied to the integrated circuit load, wherein further the singular transistor comprises a single-gate transistor;

computer usable program code for coupling the first virtual potential device to a first conductor; and computer usable program code for coupling the integrated circuit load to a second conductor, wherein the first conductor and the second conductor are to be coupled to a power supply.

18. The computer program product of claim 17, further comprising computer usable program code for coupling a second virtual potential device to the integrated circuit load and to the second conductor, wherein the second virtual potential device is adapted to monitor and control a second voltage to be supplied to the integrated circuit load.

19. The computer program product of claim 18, wherein the computer usable program code for coupling the second virtual potential device to the integrated circuit load comprises computer usable program code for forming an n-MOS transistor with a gate and a source coupled to the integrated circuit and a drain coupled to the second conductor.

20. The computer program product of claim 17, wherein the computer usable program code for creating an integrated circuit load comprises computer usable program code for forming at least one cache memory device.

* * * * *